United States Patent
Zhuang et al.

(10) Patent No.: US 9,312,281 B2
(45) Date of Patent: Apr. 12, 2016

(54) TFT ARRAY SUBSTRATE, LCD PANEL AND WIRING REPAIRING METHOD

(75) Inventors: Yizhuang Zhuang, Shenzhen (CN);
Jungmao Tsai, Shenzhen (CN);
Songxian Wen, Shenzhen (CN);
Mingfeng Deng, Shenzhen (CN);
Xiaoxin Zhang, Shenzhen (CN)

(73) Assignee: SHENZHEN CHINA STAR OPOELECTRONICS TECHNOLOGY CO., LTD., Shenzhen (CN)

( * ) Notice: Subject to any disclaimer, the term of this patent is extended or adjusted under 35 U.S.C. 154(b) by 724 days.

(21) Appl. No.: 13/375,230

(22) PCT Filed: Sep. 29, 2011

(86) PCT No.: PCT/CN2011/080371
§ 371 (c)(1),
(2), (4) Date: Nov. 30, 2011

(87) PCT Pub. No.: WO2013/013444
PCT Pub. Date: Jan. 31, 2013

(65) Prior Publication Data
US 2013/0027624 A1    Jan. 31, 2013

(30) Foreign Application Priority Data

Jul. 25, 2011   (CN) .......................... 2011 1 0208993

(51) Int. Cl.
*G02F 1/1362*   (2006.01)
*H01L 27/12*    (2006.01)
(Continued)

(52) U.S. Cl.
CPC ............ *H01L 27/124* (2013.01); *G02F 1/1309* (2013.01); *G02F 1/1345* (2013.01)

(58) Field of Classification Search
CPC ................. G02F 2001/136263; G02F 1/1309;
G02F 1/1345; G02F 1/13452; G02F 1/13454;
G02F 1/136204; H01L 27/124
See application file for complete search history.

(56) References Cited

U.S. PATENT DOCUMENTS

| 5,729,309 A | * | 3/1998 | Na et al. .......................... 349/54 |
| 5,982,355 A | * | 11/1999 | Jaeger ................. G02F 1/13306 345/161 |

(Continued)

FOREIGN PATENT DOCUMENTS

| CN | 1818749 | * | 8/2006 | .............. G02F 1/133 |
| CN | 1818749 A | | 8/2006 | |

(Continued)

OTHER PUBLICATIONS

1st Office Action of Chinese Patent Application No. 201110208993.8 issued by Chinese Patent Office.

(Continued)

*Primary Examiner* — Edward Glick
*Assistant Examiner* — Anthony G Quash

(57) ABSTRACT

A TFT array substrate includes a pixel region and a wiring region disposed outside the pixel region. The wiring region has a wiring layer including scan or data wirings. A repair wiring layer including repair wiring is disposed insulatedly below or above the wiring layer. A scan or data wiring has a first intersection and a second intersection with a repair wiring section of the repair wiring. When the scan or data wiring is broken, a repair wiring section is cut off the repair wiring by a first cut-off point and a second cut-off point, and the broken scan or data wiring is electrically connected to the repair wiring section through soldering the first intersection and the second intersection. Thus, products that would otherwise be rejected in the manufacturing process of LCD panels can be repaired, which decreases the reject ratio, increases the yield and saves the production cost.

14 Claims, 5 Drawing Sheets

(51) Int. Cl.
*G02F 1/13* (2006.01)
*G02F 1/1345* (2006.01)

(56) References Cited

U.S. PATENT DOCUMENTS

| | | | |
|---|---|---|---|
| 2002/0018175 A1* | 2/2002 | Hong et al. | 349/192 |
| 2006/0221295 A1* | 10/2006 | Hein | G02F 1/133382 349/161 |
| 2008/0158127 A1* | 7/2008 | Chang | G02F 1/136259 345/93 |
| 2008/0227223 A1* | 9/2008 | Lai | 438/4 |
| 2011/0140797 A1* | 6/2011 | Lee | H03B 5/1847 331/167 |

FOREIGN PATENT DOCUMENTS

| | | | | |
|---|---|---|---|---|
| CN | 101788729 | * | 7/2010 | G02F 1/13 |
| CN | 101788729 A | | 7/2010 | |
| JP | 59127515 | * | 7/1984 | H02G 1/16 |

OTHER PUBLICATIONS

International Search Report of the PCT Application No. PCT/CN2011/080371.

* cited by examiner

TFT ARRAY SUBSTRATE, LCD PANEL AND WIRING REPAIRING METHOD

BACKGROUND

1. Technical Field

The present disclosure relates to the field of liquid crystal display (LCD) technologies, and more particularly, to a thin film transistor (TFT) array substrate, an LCD panel and a wiring repairing method that allow for repair of a wiring.

2. Description of Related Art

A TFT LCD panel mainly comprises a TFT array substrate, a color film (CF) substrate, and a liquid crystal molecule layer filled in a cell formed by the TFT array substrate and the CF substrate. The TFT array substrate is formed thereon with scan lines for providing scanning signals, data lines for providing data signals and a pixel region defined by the scan lines and the data lines. Pixel electrodes are disposed within the pixel region, while a wiring region corresponding to the scan lines and the data lines is disposed outside the pixel region.

The manufacturing process of an LCD panel mainly includes an array process for manufacturing a TFT array substrate and a CF substrate, a cell process for assembling the TFT array substrate and the CF substrate into a cell and dropping a liquid crystal material into the cell, and a module process. In these processes, any deviation might cause a defect in the LCD panel; for example, a short or a break of wirings in the LCD panel might compromise the quality of images displayed. As shown in FIG. 1, on a wiring region 2 outside a pixel region 1 of the TFT array substrate, a break of wirings (scan wirings or data wirings) 3 often occur at some locations due to particulate impurities for example.

In the prior art, as shown in FIG. 1, a broken wiring 3 is usually repaired by a wiring operation (i.e. by a repair wire 4 accomplished through chemical vapor deposition (CVD)). However, since the wiring operation has to be carried out in a very limited space of the LCD panel, it is difficult to ensure the electric properties of the wiring. Furthermore, repair becomes even impossible for broken wirings that are found after the cell process, so products with such defects have to be rejected, which represents a considerable waste.

Therefore, the conventional wiring repairing method leads to a low yield of LCD panels and adds to both the production cost and the number of manufacturing steps, so it has become unable to satisfy the ever heightened requirements of LCD panel production.

BRIEF SUMMARY

The primary objective of the present disclosure is to provide a TFT array substrate, an LCD panel and a wiring repairing method which can increase the yield of LCD panels and lower the production cost.

To achieve the aforesaid objective, the present disclosure provides a thin film transistor (TFT) array substrate, includes a pixel region, a wiring region disposed outside the pixel region, and driving integrated circuits, the wiring region has a wiring layer included of scan or data wirings, the scan or data wirings are electrically connected to the driving integrated circuits accordingly, wherein a repair wiring layer included of repair wirings is disposed insulatedly below or above the wiring layer in the wiring region, a number of the repair wirings is corresponds to that of the driving integrated circuits, a scan or data wiring has a first intersection and a second intersection with a repair wiring section of the repair wiring, when the scan or data wiring is broken, a repair wiring section is cut off the repair wiring by a first cut-off point and a second cut-off point, and the broken scan or data wiring is electrically connected to the repair wiring section through soldering the first intersection and the second intersection.

The present disclosure further provides a TFT array substrate, which includes a pixel region and a wiring region disposed outside the pixel region, the wiring region has a wiring layer comprised of scan or data wirings, wherein a repair wiring layer comprised of repair wiring is disposed insulatedly below or above the wiring layer in the wiring region, a scan or data wiring has a first intersection and a second intersection with a repair wiring section of the repair wiring, when the scan or data wiring is broken, a repair wiring section is cut off the repair wiring by a first cut-off point and a second cut-off point, and the broken scan or data wiring is electrically connected to the repair wiring section through soldering the first intersection and the second intersection.

The present disclosure further provides a liquid crystal display (LCD) panel comprising the TFT array substrate described above.

The present disclosure further provides a wiring repairing method for an LCD, comprising the following steps of:

disposing a repair wiring layer comprised of a spiral-shaped repair wiring, which is insulated from a wiring layer comprised of scan or data wirings, on a wiring region outside a pixel region of the LCD panel, wherein a scan or data wiring has a first intersection and a second intersection with a repair wiring section of the spiral-shaped repair wiring, the repair wiring layer is located above or below the wiring layer;

cutting the repair wiring section off the spiral-shaped repair wiring by a first cut-off point and a second cut-off point, if the scan or data wiring is broken;

electrically connecting the repair wiring section to the broken scan or data wiring through soldering the first intersection and the second intersection.

According to the TFT array substrate, the LCD panel and the wiring repairing method of the present disclosure, it achieves the purpose of repairing the broken scan or data wirings, decreases the reject ratio, increases the yield and saves the production cost.

Hereinafter, implementations, functional features and advantages of the present disclosure will be further described with reference to embodiments thereof and the attached drawings.

DETAILED DESCRIPTION

Hereinafter, technical solutions of the present disclosure will be detailed with reference to the attached drawings and embodiments thereof. However, it shall be understood that, the embodiments described herein are only intended to illustrate but not to limit the present disclosure.

According to the technical solutions of the present disclosure, a repair wiring layer comprised of spiral-shaped repair wiring is additionally disposed in a wiring region of a LCD panel. So, when a scan or data wiring is broken in a manufacturing process of the LCD panel, a repair wiring section of the spiral-shaped repair wiring, which intersects with the broken scan or data wiring at both sides of a breaking point, is cut off and then electrically connected to the broken scan or data wiring at the intersections through soldering to replace the broken wiring for repairing purpose. In this way, the yield of products is improved.

Figure 1:
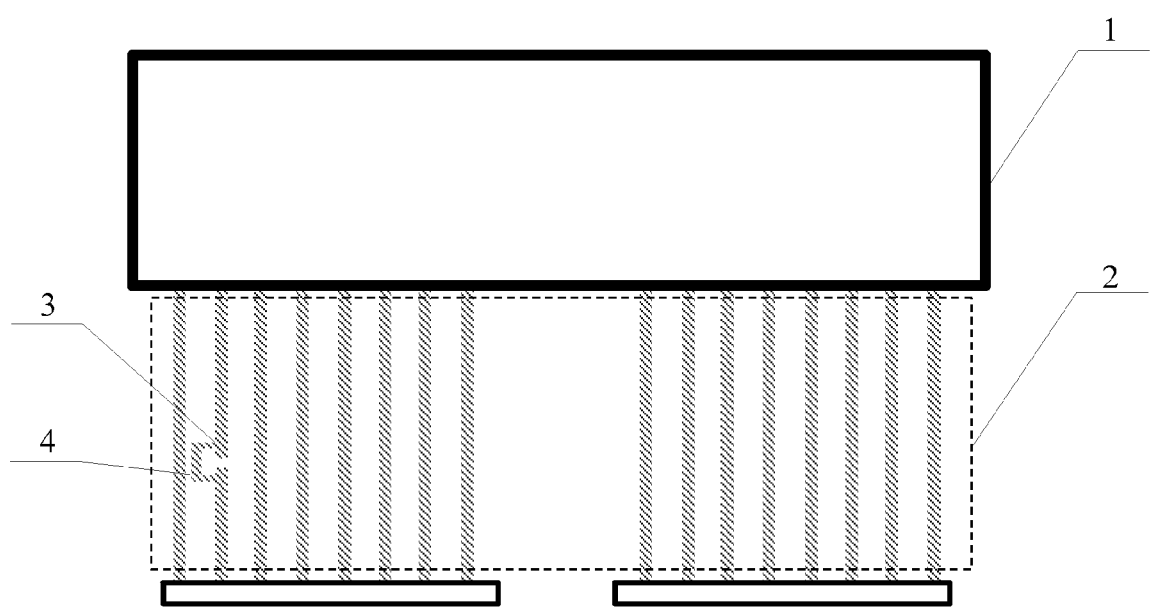
FIG. 1 is a schematic view illustrating how a scan or data wiring on a TFT array substrate is repaired in the prior art.
Figure 2:
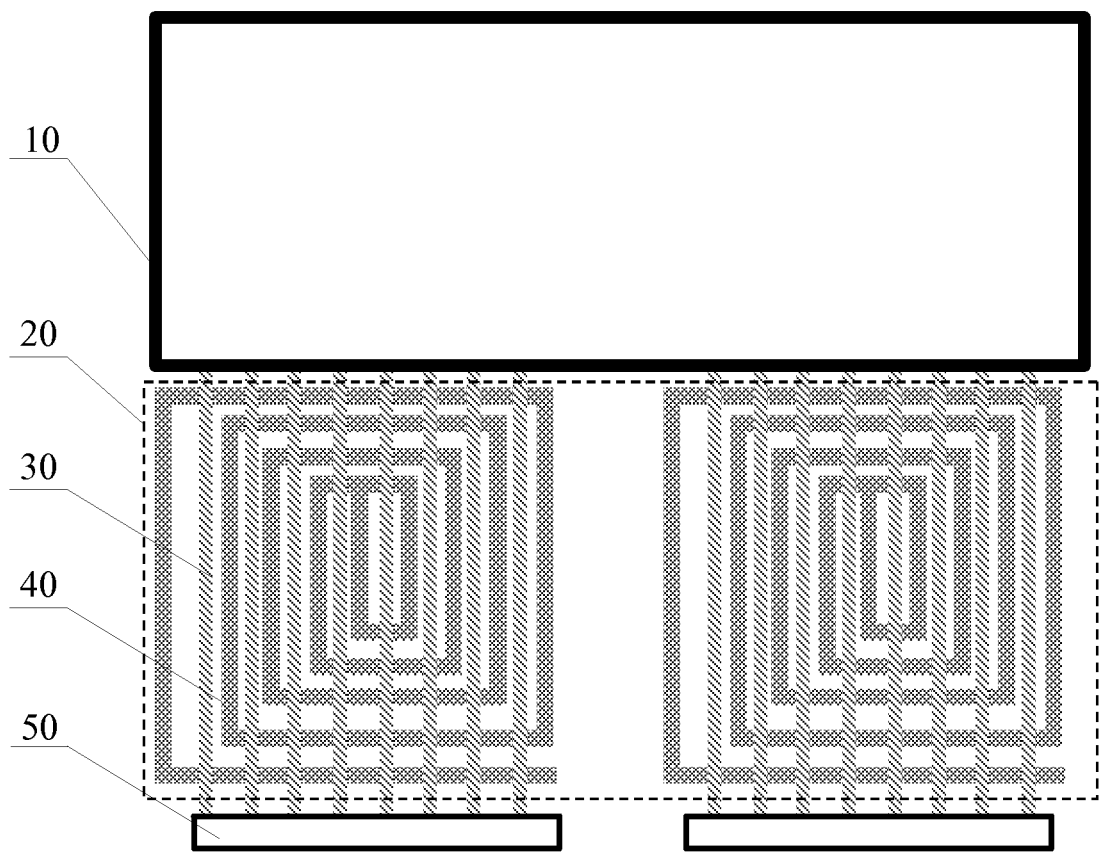
FIG. 2 is a schematic structural view of a first embodiment of a TFT array substrate according to the present disclosure.

Referring to FIG. 2, there is shown a schematic structural view of a first embodiment of a TFT array substrate according to the present disclosure. The TFT array substrate of the first embodiment of the present disclosure includes scan lines (not shown) for providing scanning signals, data lines (not shown) for providing data signals, a pixel region 10, a wiring region 20 disposed outside the pixel region 10 and driving integrated circuits (ICs) 50. The wiring region 20 has a wiring layer comprised of scan or data wirings 30 (the scan line in the wiring region 20 is defined as the scan wiring; the data line in the wiring region 20 is defined as the data wiring), and each of the scan or data wirings 30 of the wiring layer is electrically connected to the driving integrated circuits (ICs) 50. In this embodiment, a repair wiring layer comprised of spiral-shaped repair wirings 40 is disposed above the wiring layer in the wiring region 20. The repair wiring layer and the wiring layer are different layer, and an insulation layer (not shown) is disposed between the repair wiring layer and the wiring layer to insulate the repair wiring layer from the wiring layer.

The repair wiring layer, the wiring layer and the insulation layer may be formed in the following way: firstly, a metal layer is coated on the TFT substrate; then, the scan or data wirings 30 that meet requirements are fabricated to form the wiring layer; and an insulation layer is sprayed on the wiring layer, and finally, another metal layer is sprayed on the insulation layer to form the repair wiring layer that meets requirements.

In this embodiment, the scan or data wirings 30 of the wiring layer are all disposed in parallel with each other, so the spiral-shaped repair wiring 40 of the repair wiring layer intersect with the scan or data wirings 30 at a plurality of intersections.

Figure 3:
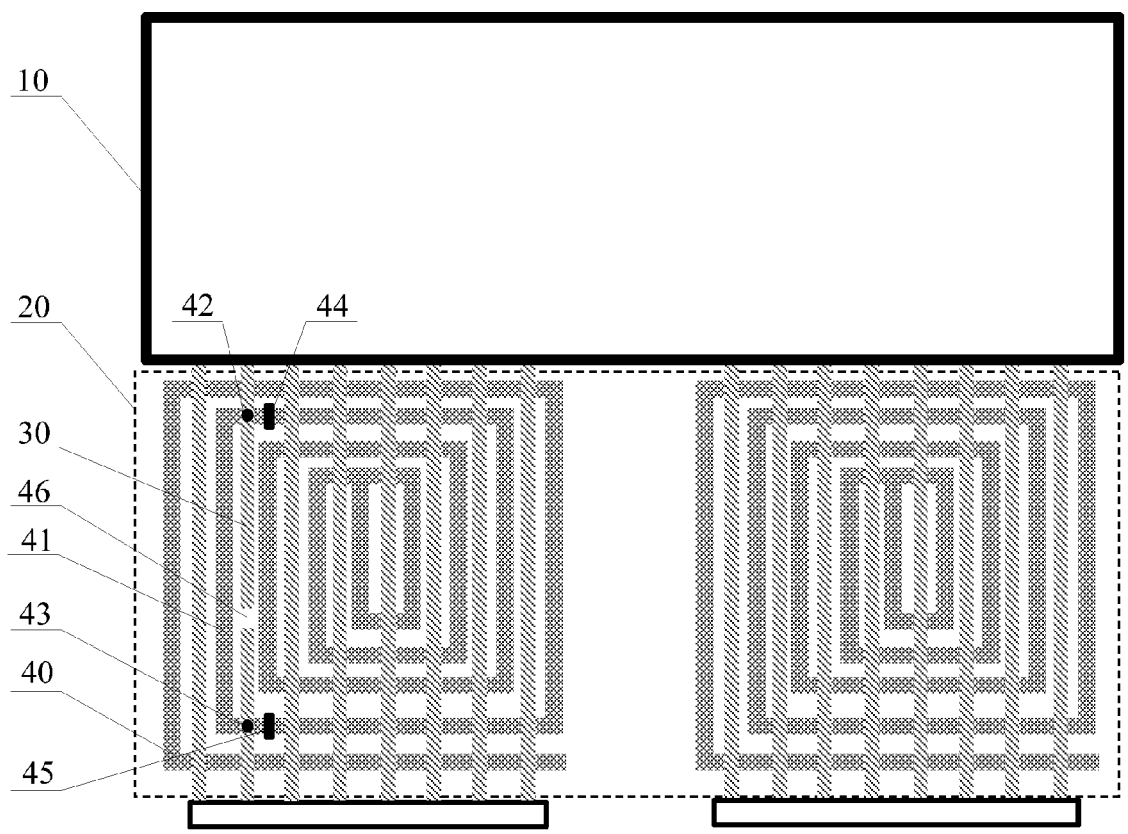
FIG. 3 is a schematic view illustrating how a scan or data wiring is repaired in the first embodiment of the TFT array substrate according to the present disclosure.

As shown in FIG. 3, there is shown a schematic view illustrating how a scan or data wiring is repaired in the first embodiment of the TFT array substrate according to the present disclosure. A theory of wiring repairing of this embodiment is as follows:

A scan or data wiring 30 of the wiring layer has a first intersection 42 and a second intersection 43 with a repair wiring section 41 of the spiral-shaped repair wiring 40 of the repair wiring layer. In case the scan or data wiring 30 is broken (as shown by the breaking point 46 in FIG. 3), the repair wiring section 41 that intersects with the broken scan or data wiring 30 at both sides of the breaking point 46 is cut off the spiral-shaped repair wiring 40 by a first cut-off point 44 and a second cut-off point 45 as shown in FIG. 3. Then, the first intersection 42 and the second intersection 43 is melted to solder the broken scan or data wiring 30 with the repair wiring section 41, that is to say, to make the broken scan or data wiring 30 and the repair wiring section 41 electrically connected together. In this way, the broken scan or data wiring 30 is replaced by the repair wiring section 41 that is cut off the spiral-shaped repair wiring 40, thus achieving the purpose of repairing the broken scan or data wiring 30, decreasing the reject ratio, increasing the yield and saving the production cost.

In this embodiment, the repair wiring layer is comprised of the spiral-shaped repair wiring 40. However, in other embodiments, the repair wiring layer may be comprised of an approximately spiral-shape repair wiring, and the repair wiring layer may also be comprised of a plurality of closed frame-shaped repair wirings nested into each other.

Because the scan or data wires 30 of the wiring layer are all parallel with each other, the repair wiring sections 41 that are parallel with the scan or data wirings 30 of the repair wiring layer may be arranged alternately with the scan or data wirings 30 so that the repairing process can be accomplished more intuitively and accurately.

Additionally, in this embodiment, a number of spiral-shape repair wiring 40 is equal to a number of driving ICs 50 disposed on the TFT array substrate, and spiral-shape repair wiring 40 are disposed on the wiring layer 20 side by side corresponding to the driving ICs 50. Specifically, the number of spiral-shape repair wiring 40 is two in this embodiment, although the number of spiral-shape repair wiring 40 may also be more than two depending on the number of driving ICs 50 disposed on the TFT array substrate.

It shall be appreciated that, in other embodiments, the repair wiring layer may also be disposed below the wiring layer.

In this embodiment, the broken scan or data wiring 30 can be repaired either prior to the cell process or after the cell process according to the theory of wiring repairing. Meanwhile, different repair wiring sections 41 of the repair spiral-shaped wiring 40 may be selected depending on different locations of breaking points of the broken scan or data wirings 30, so the theory of wiring repairing is also applicable to cases that a plurality of the scan or data wirings 30 are broken.

Compared with the prior art described above, this embodiment of the present disclosure achieves the purpose of repairing the broken scan wirings or data wirings, decreases the reject ratio, increases the yield and saves the production cost.

Figure 4:
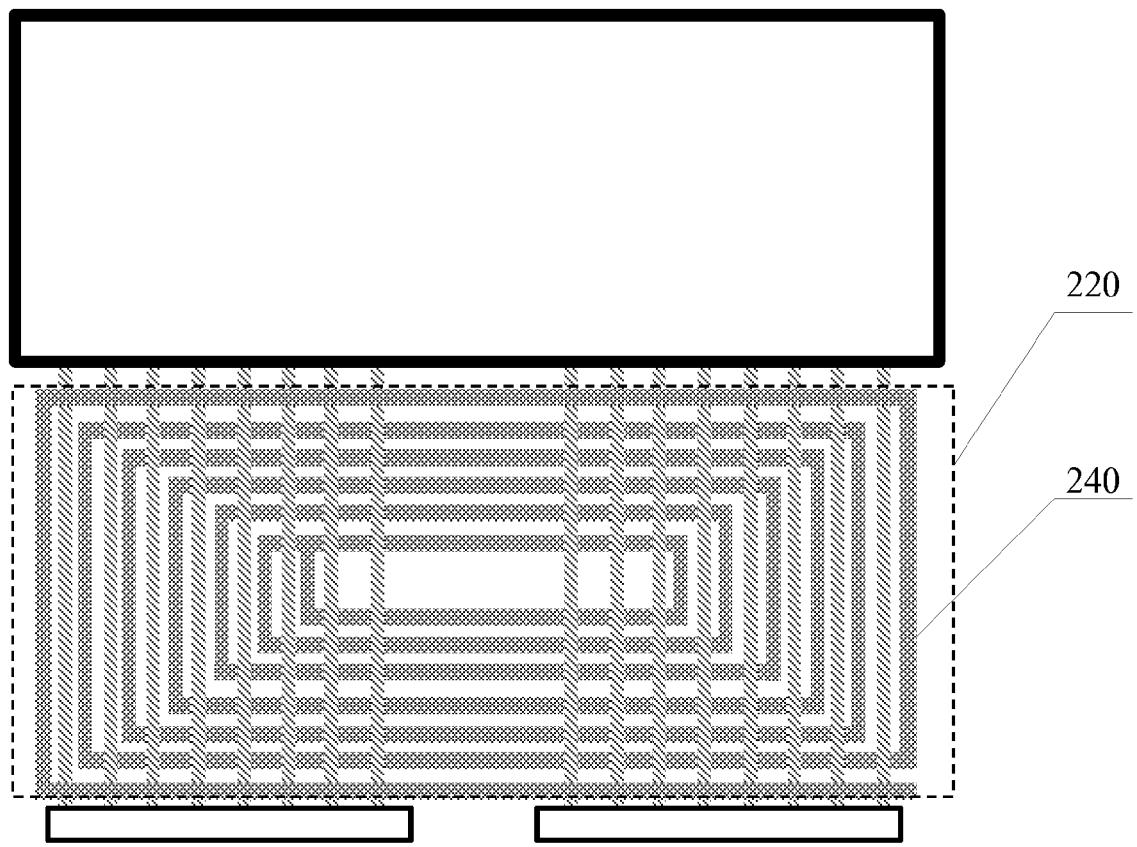
FIG. 4 is a schematic structural view of a second embodiment of a TFT array substrate according to the present disclosure.

Referring to FIG. 4, there is shown a schematic structural view of a second embodiment of a TFT array substrate according to the present disclosure. The second embodiment differs from the first embodiment in that: there is only one spiral-shaped repairing wiring 240 and the spiral-shaped repairing wiring 240 covers the whole wiring region 220 in this embodiment. Other aspects are all similar to those of the first embodiment.

Furthermore, the present disclosure also provides an LCD panel comprising a TFT array substrate as described above. And, no further description will be made again herein.

Figure 5:
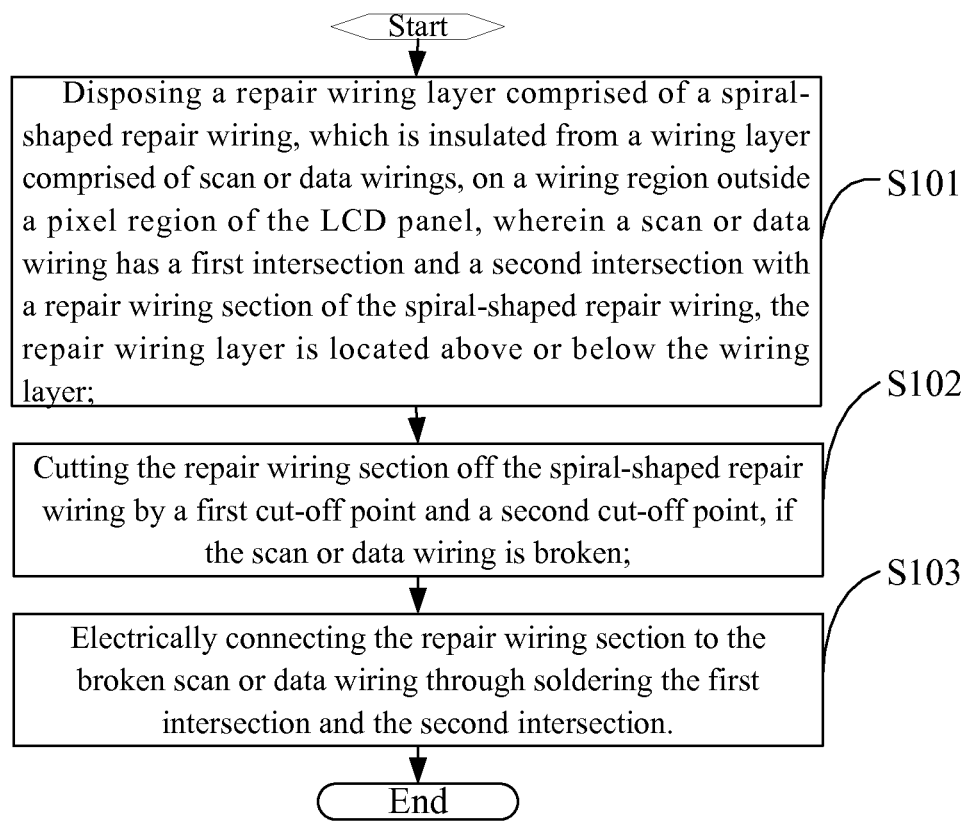
FIG. 5 is a schematic flowchart diagram of an embodiment of a wiring repairing method for an LCD panel according to the present disclosure.

Referring to FIG. 5, there is shown a schematic flowchart diagram of an embodiment of a wiring repairing method for an LCD panel according to the present disclosure. The wiring repairing method for an LCD panel according to the present disclosure includes the following steps:

step S101: disposing a repair wiring layer comprised of spiral-shaped repair wiring, which is insulated from a wiring layer comprised of scan or data wirings, on a wiring region of a LCD panel, wherein a scan or data wiring of the wiring layer has a first intersection and a second intersection with a repair wiring section of the spiral-shaped repair wiring of the repair wiring layer, the repair wiring layer is located above or below the wiring layer in the wiring region and the wiring region is outside a pixel region of the LCD panel;

step S102: cutting the repair wiring section off the spiral-shaped repair wiring by a first cut-off point and a second cut-off point, if the scan or data wiring is broken;

step S103: electrically connecting the repair wiring section to the broken scan wiring or data wiring through soldering the first intersection and the second intersection.

Specifically, the theory of wiring repairing of this embodiment is as follows: as shown in FIG. 3, the scan or data wiring 30 of the wiring layer intersects with the repair wiring section 41 of the spiral-shaped repair wiring 40 of the repair wiring layer 40 at the first intersection 42 and the second intersection 43. In case the scan or data wiring 30 is broken (as shown by the breaking point 46 in FIG. 3), the repair wiring section 41 that intersects with the broken scan or data wiring 30 at both sides of the breaking point 46 is cut off the spiral-shaped repair wiring 40 by a first cut-off point 44 and a second cut-off point 45 as shown in FIG. 3. Then, the first intersection 42 and the second intersection 43 is melted to solder the broken scan or data wiring 30 with the repair wiring section 41. In this way, the broken scan or data wiring 30 is replaced by the repair wiring section 41 that is cut off the spiral-shaped repair wiring 40, thus achieving the purpose of repairing the broken scan or data wiring 30. Additionally, different repair wiring sections of the repair spiral-shaped wiring may be selected depending on different locations of breaking points of the broken wirings, so the theory of wiring repairing is also applicable to cases that a plurality of wirings are broken.

In this embodiment, the repair wiring layer may be comprised of an approximately spiral-shape repair wiring, or may be comprised of a plurality of closed frame-shaped repair wirings nested into each other.

Because the scan or data wires of the wiring layer are all parallel with each other, the repair wiring sections that are parallel with the scan or data wirings of the repair wiring layer may be arranged alternately with the scan or data wirings so that the repairing process can be accomplished more intuitively and accurately.

Additionally, in this embodiment, there may be one, two or more spiral-shape repair wirings. If there is only one spiral-shape repair wirings, the spiral-shape repair wiring covers the whole wiring region; and if there is more than one spiral-shape repair wiring, then the number of the spiral-shape repair wirings is equal to the number of driving ICs 50 disposed on the TFT array substrate, and the spiral-shape repair wirings are disposed in the wiring region side by side corresponding to the driving ICs 50.

According to the TFT array substrate, the LCD panel and the wiring repairing method of the present disclosure, it achieves the purpose of repairing the broken scan or data wirings, decreases the reject ratio, increases the yield and saves the production cost.

What described above are only preferred embodiments of the present disclosure but are not intended to limit the scope of the present disclosure. Accordingly, any equivalent structural or process flow modifications that are made on basis of the specification and the attached drawings or any direct or indirect applications in other technical fields shall also fall within the scope of the present disclosure.

The invention claimed is:

1. A thin film transistor (TFT) array substrate, comprising a pixel region, a wiring region disposed outside the pixel region, and driving integrated circuits, the wiring region has a wiring layer comprised of scan or data wirings, the scan or data wirings are electrically connected to the driving integrated circuits accordingly, wherein a repair wiring layer comprised of only one spiral-shaped repair wiring is disposed insulatedly below or above the wiring layer in the wiring region, with sections of the spiral-shaped repair wiring being respectively arranged between adjacent scan or data wirings, each of the scan or data wirings has a first set of intersections and a second set of intersections with a repair wiring section of the spiral-shaped repair wiring, each of the sets of intersections of at least one of the scan or data wirings has more than one intersection, when the scan or data wiring is broken, a repair wiring section is cut off the spiral-shaped repair wiring by a first cut-off point and a second cut-off point, and the broken scan or data wiring is electrically connected to the repair wiring section through soldering the first intersection and the second intersection.

2. The TFT array substrate of claim 1, wherein between the wiring layer and the repair wiring layer is disposed an insulation layer, through which the wiring layer is insulated from the repair wiring layer.

3. The TFT array substrate of claim 2, wherein the scan or data wirings are parallel with each other, and the repair wiring sections of the repair wiring that are parallel with the scan or data wirings are arranged alternately with the scan or data wirings.

4. A TFT array substrate, comprising a pixel region and a wiring region disposed outside the pixel region, the wiring region has a wiring layer comprised of scan or data wirings, wherein a repair wiring layer comprised of only one spiral-shaped repair wiring is disposed insulatedly below or above the wiring layer in the wiring region, with sections of the spiral-shaped repair wiring being respectively arranged between adjacent scan or data wirings, each of the scan or data wirings has a first set of intersections and a second set of intersections with a repair wiring section of the spiral-shaped repair wiring, each of the sets of intersections of at least one of the scan or data wirings has more than one intersection, when the scan or data wiring is broken, a repair wiring section is cut off the repair wiring by a first cut-off point and a second cut-off point, and the broken scan or data wiring is electrically connected to the repair wiring section through soldering the first intersection and the second intersection.

5. The TFT array substrate of claim 4, wherein between the wiring layer and the repair wiring layer is disposed an insulation layer, through which the wiring layer is insulated from the repair wiring layer.

6. The TFT array substrate of claim 5, wherein the scan or data wirings of the wiring layer are parallel with each other, and the repair wiring sections of the repair wiring that are parallel with the scan or data wirings are arranged alternately with the scan or data wirings.

7. The TFT array substrate of claim 4, wherein the TFT array substrate further comprises driving integrated circuits, the scan or data wirings are electrically connected to the driving integrated circuits accordingly, a number of the repair wiring is corresponds to that of the driving integrated circuits.

8. The TFT array substrate of claim 7, wherein the number of repair wiring is one, and the repair wiring covers the whole wiring region.

9. A liquid crystal display (LCD) panel, comprising a TFT array substrate, wherein the TFT array substrate comprises a pixel region and a wiring region disposed outside the pixel region, the wiring region has a wiring layer comprised of scan or data wirings, a repair wiring layer comprised of only one spiral-shaped repair wiring is disposed insulatedly below or above the wiring layer in the wiring region, with sections of the spiral-shaped repair wiring being respectively arranged between adjacent scan or data wirings, each of the a scan or data wirings has a first set of intersections and a second set of intersections with a repair wiring section of the spiral-shaped repair wiring, each of the sets of intersections of at least one of the scan or data wirings has more than one intersection, when the scan or data wiring is broken, a repair wiring section is cut off the repair wiring by a first cut-off point and a second cut-off point, and the broken scan or data wiring is electrically connected to the repair wiring section through soldering the first intersection and the second intersection.

10. The LCD panel of claim 9, wherein between the wiring layer and the repair wiring layer is disposed an insulation layer, through which the wiring layer is insulated from the repair wiring layer.

11. The LCD panel of claim 10, wherein the scan or data wirings of the wiring layer are parallel with each other, and repair wiring sections of the repair wiring that are parallel with the scan or data wirings are arranged alternately with the scan or data wirings.

12. The LCD panel of claim 9, wherein the TFT array substrate further comprises driving integrated circuits, the scan or data wirings are electrically connected to the driving integrated circuits accordingly, a number of the repair wiring is corresponds to that of the driving integrated circuits.

13. The LCD panel of claim 12, wherein the number of repair wiring is one, and the repair wiring covers the whole wiring region.

14. A wiring repairing method for an LCD, comprising the following steps of:

disposing a repair wiring layer comprised of only one spiral-shaped repair wiring, which is insulated from a wiring layer comprised of scan or data wirings, on a wiring region outside a pixel region of the LCD panel, wherein each of the scan or data wirings has a first set of intersections and a second set of intersections with a repair wiring section of the spiral-shaped repair wiring, each of the sets of intersections of at least one of the scan or data wirings has more than one intersection, the repair wiring layer is located above or below the wiring layer, with sections of the spiral-shaped repair wiring being respectively arranged between adjacent scan or data wirings;

cutting the repair wiring section off the spiral-shaped repair wiring by a first cut-off point and a second cut-off point, if the scan or data wiring is broken;

electrically connecting the repair wiring section to the broken scan or data wiring through soldering the first intersection and the second intersection.

\* \* \* \* \*